(12) United States Patent
Choi et al.

(10) Patent No.: US 8,318,053 B2
(45) Date of Patent: Nov. 27, 2012

(54) PHOTOSENSITIVE RESIN COMPOSITION AND COLOR FILTER USING THE SAME

(75) Inventors: Jung-Sik Choi, Uiwang-si (KR); Chang-Min Lee, Uiwang-si (KR); Jin-Woo Park, Uiwang-si (KR); Kyung-Won Ahn, Uiwang-si (KR); Myung-Ho Cho, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/217,581

(22) Filed: Aug. 25, 2011

(65) Prior Publication Data

US 2012/0161088 A1    Jun. 28, 2012

(30) Foreign Application Priority Data

Dec. 24, 2010  (KR) .................. 10-2010-0134926

(51) Int. Cl.
- G02B 5/23 (2006.01)
- C08F 2/50 (2006.01)
- C08F 2/46 (2006.01)
- C08J 3/28 (2006.01)
- G03F 7/033 (2006.01)
- G03F 7/032 (2006.01)

(52) U.S. Cl. ............... 252/586; 252/582; 430/270.1; 430/281.1; 430/286.1; 430/287.1; 430/293; 522/71; 522/74; 522/79; 522/80; 522/81; 522/101; 522/103; 522/104; 522/113; 522/120; 522/123; 522/149; 522/153; 522/154; 522/178; 522/182; 522/183; 524/99

(58) Field of Classification Search .......... 204/192.15; 252/586, 582; 427/255.28; 428/451, 480; 430/7, 270.1, 281.1, 286.1, 287.1, 293; 522/33, 522/42, 46, 53, 63, 78, 79, 182, 71, 74, 80, 522/81, 101, 103, 104, 113, 120, 123, 149, 522/153, 154, 178, 183; 526/319, 320; 524/99
See application file for complete search history.

(56) References Cited

U.S. PATENT DOCUMENTS

| | | | |
|---|---|---|---|
| 4,500,897 A | 2/1985 | Matsuda et al. | |
| 4,762,752 A | 8/1988 | Haubennestel et al. | |
| 5,424,167 A | 6/1995 | Uetani et al. | |
| 5,707,432 A | 1/1998 | Adams et al. | |
| 5,708,055 A | 1/1998 | Joyce et al. | |
| 5,710,234 A | 1/1998 | Fujishiro et al. | |
| 5,721,076 A | 2/1998 | Watanabe et al. | |
| 5,803,959 A | 9/1998 | Johnson et al. | |
| 5,851,280 A | 12/1998 | Belmont et al. | |
| 5,895,522 A | 4/1999 | Belmont et al. | |
| 5,922,118 A | 7/1999 | Johnson et al. | |
| 5,968,243 A | 10/1999 | Belmont et al. | |
| 6,110,994 A | 8/2000 | Cooke et al. | |
| 6,232,025 B1 | 5/2001 | Srinivasan | |
| 6,277,183 B1 | 8/2001 | Johnson et al. | |
| 6,328,894 B1 | 12/2001 | Chan et al. | |
| 6,780,389 B2 | 8/2004 | Karl et al. | |
| 6,960,250 B2 | 11/2005 | Luethge et al. | |
| 7,132,154 B2 | 11/2006 | Shibahara et al. | |
| 7,250,209 B2 | 7/2007 | Shibahara et al. | |
| 7,376,328 B2 | 5/2008 | Takase et al. | |
| 7,592,119 B2 | 9/2009 | Nomura | |
| 7,794,917 B2 | 9/2010 | Mori et al. | |
| 2002/0187412 A1 | 12/2002 | You et al. | |
| 2004/0126592 A1 | 7/2004 | Shibahara et al. | |
| 2005/0164120 A1 | 7/2005 | Yamaoka et al. | |
| 2006/0041053 A1 | 2/2006 | Kamata et al. | |
| 2007/0101903 A1 | 5/2007 | Lee et al. | |
| 2007/0161110 A1 | 7/2007 | Iida et al. | |
| 2008/0090177 A1* | 4/2008 | Oh et al. ............ | 430/280.1 |
| 2009/0207490 A1 | 8/2009 | Moriyama et al. | |
| 2010/0085518 A1 | 4/2010 | Choi et al. | |
| 2010/0163811 A1* | 7/2010 | Oh et al. ............ | 252/586 |
| 2010/0227178 A1* | 9/2010 | Oouchi et al. ........ | 428/451 |

FOREIGN PATENT DOCUMENTS

| | | |
|---|---|---|
| CN | 1606597 | 4/2005 |
| CN | 1606600 | 4/2005 |
| EP | 1471112 A1 | 10/2004 |
| JP | 60237403 | 11/1985 |
| JP | 1152449 | 6/1989 |
| JP | 1200353 | 8/1989 |
| JP | 4007373 | 1/1992 |
| JP | 4091173 | 3/1992 |
| JP | 4163552 | 6/1992 |

(Continued)

OTHER PUBLICATIONS

Office Action in commonly owned U.S. Appl. No. 12/504,409 mailed on Nov. 18, 2010, pp. 1-12.
Taiwanese Office Action in commonly owned Taiwanese Application No. 095144145 dated Jun. 4, 2010, pp. 1-5.
English translation of Taiwanese Search Report in commonly owned Taiwanese Application No. 095144145 dated May 11, 2010, pp. 1.
Office Action in commonly owned U.S. Appl. No. 12/323,554 mailed Dec. 29, 2009, pp. 1-18.
Office Action in commonly owned U.S. Appl. No. 13/161,542 mailed Jan. 6, 2012, pp. 1-14.

(Continued)

*Primary Examiner* — Bijan Ahvazi
(74) *Attorney, Agent, or Firm* — Summa, Additon & Ashe, P.A.

(57) ABSTRACT

Disclosed is a photosensitive resin composition including (A) a photopolymerizable monomer including a compound represented by the following Chemical Formula 1, wherein the substituents of Chemical Formula 1 are the same as defined in the specification, (B) a binder resin, (C) a photopolymerization initiator, (D) a pigment and (E) a solvent, and a color filter using the same.

[Chemical Formula 1]

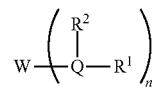

8 Claims, 1 Drawing Sheet

FOREIGN PATENT DOCUMENTS

| | | | |
|---|---|---|---|
| JP | 05-339356 | A | 12/1993 |
| JP | 06-001938 | A | 1/1994 |
| JP | 07-064281 | A | 3/1995 |
| JP | 07-64282 | | 3/1995 |
| JP | 08-278630 | A | 10/1996 |
| JP | 09-022653 | A | 1/1997 |
| JP | 09-291224 | | 11/1997 |
| JP | 09-304929 | | 11/1997 |
| JP | 10-010311 | A | 1/1998 |
| JP | 10-067970 | | 3/1998 |
| JP | 10-204321 | A | 8/1998 |
| JP | 10218973 | | 8/1998 |
| JP | 10-253820 | A | 9/1998 |
| JP | 10-510861 | | 10/1998 |
| JP | 11-060989 | A | 3/1999 |
| JP | 11231523 | A | 8/1999 |
| JP | 2000-056120 | | 2/2000 |
| JP | 2000-171969 | A | 6/2000 |
| JP | 2001-131241 | | 5/2001 |
| JP | 2002-145999 | | 5/2002 |
| JP | 3287661 | B2 | 6/2002 |
| JP | 2003-066597 | | 3/2003 |
| JP | 2003-149810 | * | 5/2003 |
| JP | 2004-004762 | A | 1/2004 |
| JP | 2004-029745 | A | 1/2004 |
| JP | 2004-186227 | | 7/2004 |
| JP | 2004-198717 | A | 7/2004 |
| JP | 2004-251946 | A | 9/2004 |
| JP | 2004-292672 | A | 10/2004 |
| JP | 2004-075985 | A | 11/2004 |
| JP | 2005-215149 | | 8/2005 |
| KR | 1019910004717 | | 7/1991 |
| KR | 1019920005780 | | 7/1992 |
| KR | 1019940005617 | | 6/1994 |
| KR | 94-7778 | | 8/1994 |
| KR | 10-1995-7002313 | | 6/1995 |
| KR | 95-11163 | | 9/1995 |
| KR | 95-7003746 | | 9/1995 |
| KR | 96-11513 | | 1/1999 |
| KR | 93-700858 | | 7/2000 |
| KR | 10-0264691 | | 9/2000 |
| KR | 95-700359 | | 1/2001 |
| KR | 92-702502 | | 12/2002 |
| KR | 2003-057090 | | 7/2003 |
| KR | 96-29904 | | 5/2004 |
| KR | 10-2006-0041154 | A | 5/2006 |
| KR | 2006-70772 | A | 6/2006 |
| KR | 10-2006-0076412 | A | 7/2006 |
| KR | 10-0725023 | B1 | 5/2007 |
| KR | 10-2009-0026037 | A | 3/2009 |
| KR | 10-2010-0047648 | A | 5/2010 |
| KR | 10-2010-0053090 | A | 5/2010 |
| KR | 10-2010-0053476 | A | 5/2010 |
| WO | 2004/055597 | A1 | 7/2004 |
| WO | 2006/044676 | A2 | 4/2006 |
| WO | 2008047992 | A1 | 4/2008 |
| WO | 2010/050650 | A | 5/2010 |

OTHER PUBLICATIONS

Office Action in commonly owned U.S. Appl. No. 13/241,434 mailed Jan. 23, 2012, pp. 1-19.
Office Action in commonly owned U.S. Appl. No. 11/747,313 mailed on Dec. 22, 2010, pp. 1-4.
Office Action in commonly owned U.S. Appl. No. 11/473,876, mailed on Dec. 18, 2008, pp. 1-14.
Notice of Allowance in commonly owned U.S. Appl. No. 11/473,876, mailed on Jul. 17, 2009, pp. 1-6.
International Search Report in commonly owned International Application No. PCT/KR2007/002908, dated Sep. 21, 2007, pp. 1-2.
English Translation of Abstract for Korean Patent Application No. 92-702502.
English Translation of Abstract for Korean Patent Application No. 93-700858.
English Translation of Abstract for Korean Patent Application No. 94-7778.
English Translation of Abstract for Korean Patent Application No. 95-11163.
English Translation of Abstract for Korean Patent Application No. 95-700359.
English Translation of Abstract for Korean Patent Application No. 95-703746.
English Translation of Abstract for Korean Patent Application No. 96-11513.
English Translation of Abstract for Korean Patent Application No. 96-29904.
Machine Translation of JP 07064282 A, pp. 1-23.
Machine Translation of KR 2003057090 A, pp. 1-14.
Office Action in commonly owned copending U.S. Appl. No. 12/323,554, mailed on Jun. 24, 2009, pp. 1-25.
English abstract of JP 2004-292672, published Oct. 21, 2004, pp. 1-3.
English abstract of JP 10-204321, published Aug. 4, 1998, pp. 1-3.
English abstract of JP 2004-251946, published Sep. 9, 2004, pp. 1-4.
English abstract of JP 2004-029745, published Jan. 29, 2004, pp. 1-4.
English abstract of JP 2004-004762, published Jan. 8, 2004, pp. 1-4.
English abstract of JP 2004-075985, published Mar. 11, 2004, pp. 1-5.
English abstract of JP 2004-198717, published Jul. 15, 2004, pp. 1-6.
English abstract of JP 10-253820, published Sep. 25, 1998, pp. 1-3.
English abstract of JP 10-010311, published Jan. 16, 1998, pp. 1-3.
English abstract of JP 11-060989, published Mar. 5, 1999, pp. 1-2.
English abstract of JP 09-022653, published Jan. 21, 1997, pp. 1-2.
Office Action in commonly owned U.S. Appl. No. 11/747,313 mailed Jun. 13, 2011, pp. 1-6.
Office Action in commonly owned U.S. Appl. No. 11/747,313 mailed Nov. 23, 2011, pp. 1-6.

* cited by examiner

PHOTOSENSITIVE RESIN COMPOSITION AND COLOR FILTER USING THE SAME

CROSS-REFERENCE TO RELATED APPLICATION

This application claims priority under 35 USC Section 119 to and the benefit of Korean Patent Application No. 10-2010-0134926 filed in the Korean Intellectual Property Office on Dec. 24, 2010, the entire disclosure of which is incorporated herein by reference.

FIELD OF THE INVENTION

The present invention relates to a photosensitive resin composition and a color filter using the same.

BACKGROUND

A liquid crystal display device typically includes a lower substrate including a color filter and an ITO pixel electrode; an active circuit portion including a liquid crystal layer, a thin film transistor, and a condensing capacitor layer; and an upper substrate with an ITO pixel electrode formed therein.

The color filter includes colored layers of red, green and blue or a black light blocking layer. The colored layers represent a color by transmitting light having a particular wavelength. The light blocking layer blocks light which is transmitted out of a transparent pixel electrode of a substrate and not controlled in order to prevent contrast from being deteriorated by the light transmitted through the thin film transistor.

The color filter can be fabricated using a pigment dispersion method by repeating a series of processes: coating a transparent substrate with a photopolymerizable composition including a colorant, performing an exposure to form a pattern of a desired shape, removing unexposed part with a solvent, and performing a thermosetting process.

However, when a photosensitive polyimide or a phenol-based resin is used as a binder resin in the pigment dispersion method, there can be drawbacks such as high heat resistance, low sensitivity, and the use of an organic solvent for development. In addition, a conventional system using an azide compound as a photoresist agent can have problems such as low sensitivity, poor heat resistance, and sensitivity to oxygen during exposure.

An acrylic-based resin can have excellent heat resistance, contraction resistance, and chemical resistance but also can have poor sensitivity, developability, and close contacting (adhesion) property. Moreover, when the light blocking layer includes a large amount of black pigment to meet the required optical density, there can be significant deterioration in the sensitivity, developability and close contacting property.

SUMMARY

An exemplary embodiment of the present invention provides a photosensitive resin composition than can have excellent sensitivity, fine line-forming property, heat resistance, chemical resistance, close contacting properties, developability, and pattern characteristics.

Another embodiment of the present invention provides a color filter manufactured using the photosensitive resin composition for a color filter.

According to one embodiment of the present invention, a photosensitive resin composition includes (A) a photopolymerizable monomer including a compound represented by the following Chemical Formula 1; (B) a binder resin; (C) a photopolymerization initiator; (D) a pigment; and (E) a solvent.

[Chemical Formula 1]

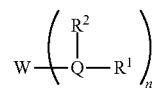

In Chemical Formula 1,

W is a structure represented by the following Chemical Formulae 2-1 to 2-4,

Q is substituted or unsubstituted C1 to C20 alkylene, substituted or unsubstituted C2 to C20 alkenylene, substituted or unsubstituted C2 to C20 alkynylene, substituted or unsubstituted C3 to C30 cycloalkylene, substituted or unsubstituted C3 to C30 cycloalkenylene, substituted or unsubstituted C3 to C30 cycloalkynylene, or substituted or unsubstituted C6 to C30 arylene, $R^1$ is substituted or unsubstituted (meth)acrylate or substituted or unsubstituted azide, $R^2$ is hydrogen, hydroxyl, or a substituent represented by the following Chemical Formulae 3-1 to 3-8, and n is an integer ranging from 2 to 4.

[Chemical Formula 2-1]

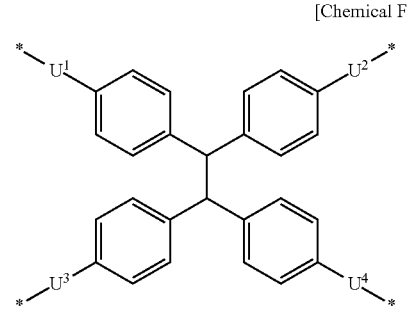

[Chemical Formula 2-2]

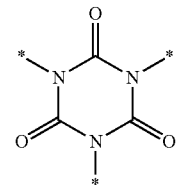

[Chemical Formula 2-3]

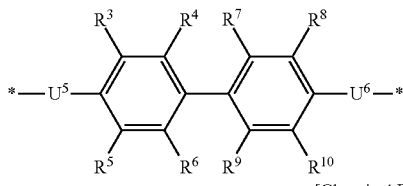

[Chemical Formula 2-4]

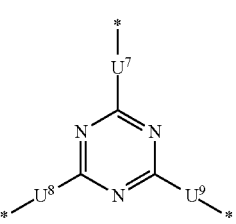

In Chemical Formulae 2-1 to 2-4, $U^1$ to $U^9$ are the same or different and are independently O, NH, S or NR' (wherein R' is substituted or unsubstituted C1 to C20 alkylene or substituted or unsubstituted C6 to C30 arylene), and $R^3$ to $R^{10}$ are the same or different and are independently hydrogen, halogen, substituted or unsubstituted C1 to C20 alkyl, or substituted or unsubstituted C6 to C30 aryl.

[Chemical Formula 3-1]

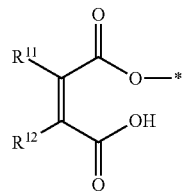

In Chemical Formula 3-1,
$R^{11}$ and $R^{12}$ are the same or different and are independently hydrogen, substituted or unsubstituted C1 to C20 alkyl, ester, or ether.

[Chemical Formula 3-2]

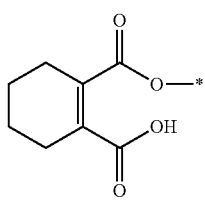

[Chemical Formula 3-3]

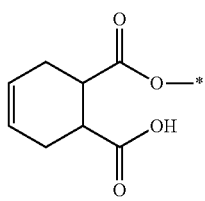

[Chemical Formula 3-4]

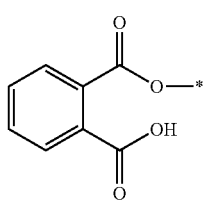

[Chemical Formula 3-5]

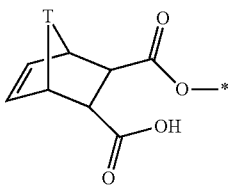

In Chemical Formula 3-5, T is O, S, NH, substituted or unsubstituted C1 to C20 alkylene, substituted or unsubstituted C1 to C20 alkylamine, or substituted or unsubstituted C1 to C20 alkylamine.

[Chemical Formula 3-6]

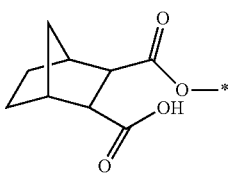

[Chemical Formula 3-7]

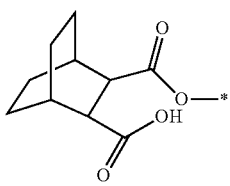

[Chemical Formula 3-8]

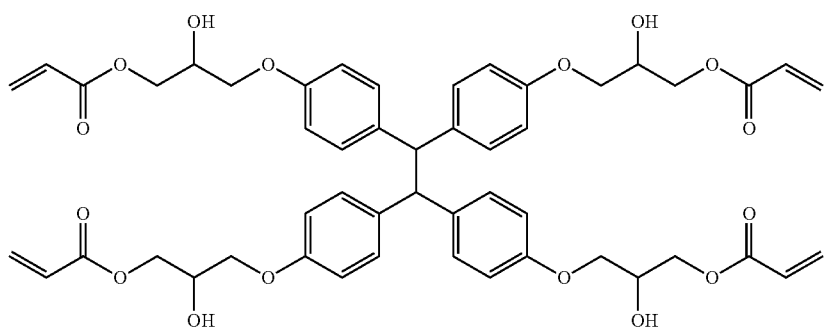

In exemplary embodiments, in Chemical Formula 1, $R^1$ can be substituted or unsubstituted (meth)acrylate and $R^2$ can be hydroxy or a substituent represented by Chemical Formulae 3-1 to 3-8.

The compound represented by Chemical Formula 1 may include one of the compounds represented by the following Chemical Formulae 4-1 to 4-4, or a combination thereof.

[Chemical Formula 4-1]

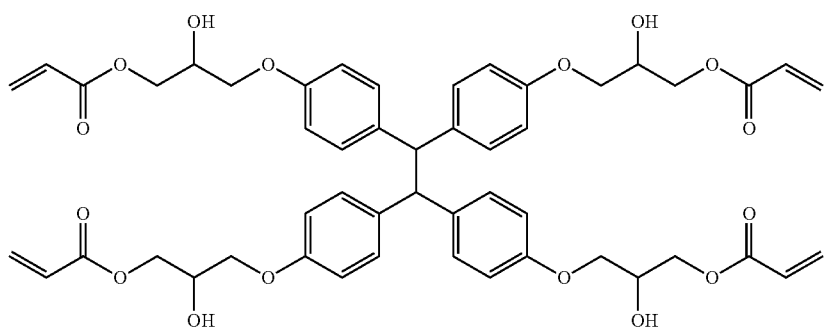

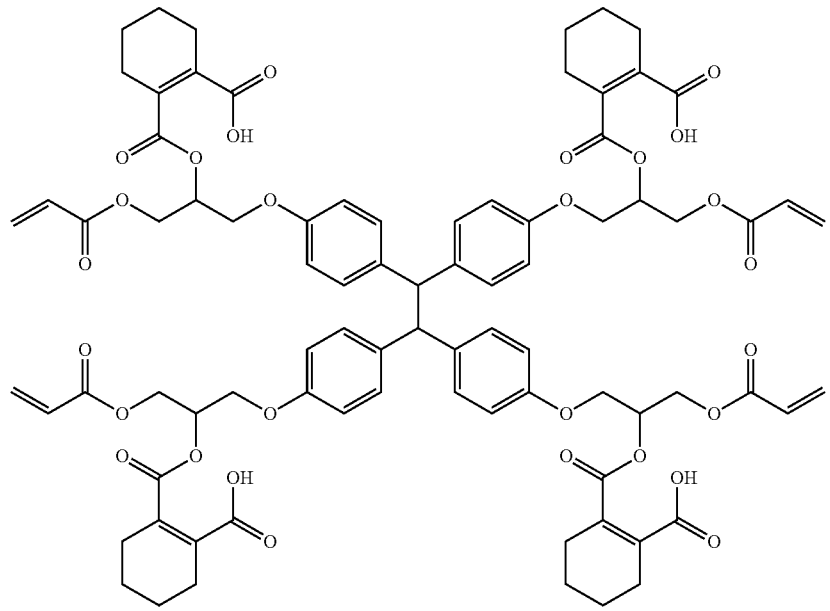
[Chemical Formula 4-2]
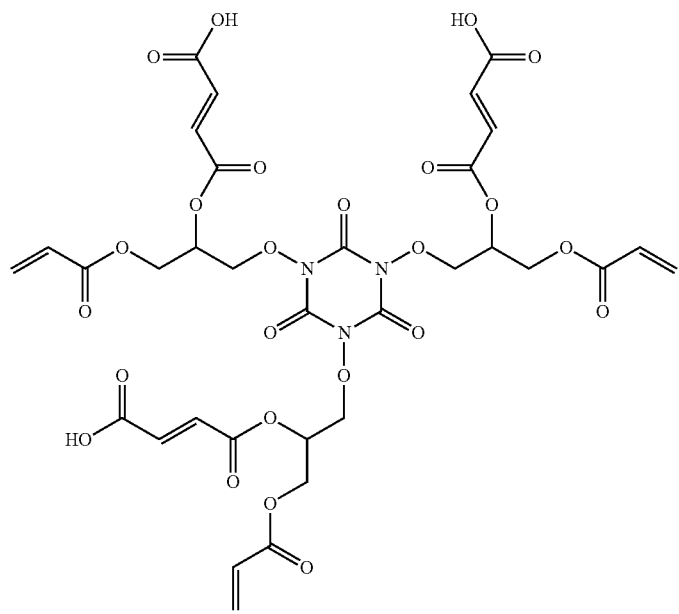
[Chemical Formula 4-3]

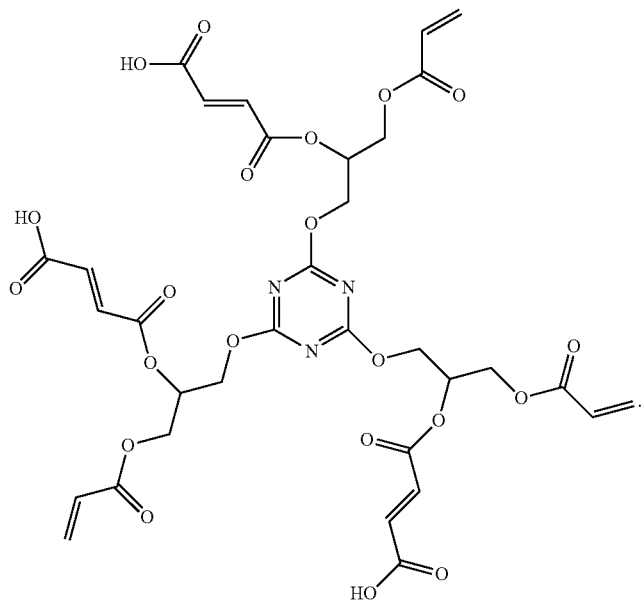

The photosensitive resin composition may include about 0.1 to about 30 wt % of the photopolymerizable monomer (A); about 1 to about 30 wt % of the binder resin (B); about 0.1 to about 10 wt % of the photopolymerization initiator (C); about 1 to about 30 wt % of the pigment (D); and a balance amount of the solvent (E).

The photopolymerizable monomer (A) may further include a reactive unsaturated compound. Examples of the reactive unsaturated compound include without limitation ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy (meth)acrylate, ethylene glycol monomethylether (meth)acrylate, trimethylol propane tri(meth)acrylate, tris(meth)acryloyloxyethyl phosphate, novolacepoxy(meth)acrylate, and the like, and combinations thereof.

The photopolymerizable monomer (A) may include the compound represented by Chemical Formula 1 and the reactive unsaturated compound in a weight ratio of about 1:99 to about 99:1.

The binder resin (B) may include a cardo-based resin, an acrylic-based resin, or a combination thereof.

The cardo-based resin may include a compound including a repeating unit represented by the following Chemical Formula 5.

[Chemical Formula 5]

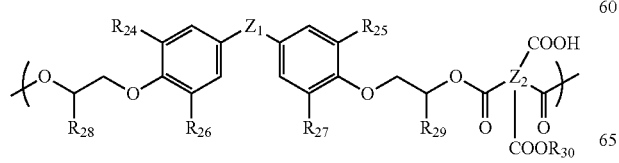

In Chemical Formula 5, $R_{24}$ to $R_{27}$ are the same or different and are independently hydrogen, halogen, or substituted or unsubstituted C1 to C20 alkyl, $R_{28}$ and $R_{29}$ are the same or different and are independently hydrogen or $CH_2OR_a$ (wherein $R_a$ is a vinyl group, an acrylic group, or a methacrylic group), $R_{30}$ is hydrogen, substituted or unsubstituted C1 to C20 alkyl, substituted or unsubstituted C2 to C20 alkenyl, an acrylic group, or a methacrylic group, $Z_1$ is a single bond, O, CO, $SO_2$, $CR_bR_c$, $SiR_dR_e$ (wherein $R_b$ to $R_e$ are the same or different and are independently hydrogen or substituted or unsubstituted C1 to C20 alkyl), or a linking group represented by the following Chemical Formulae 6-1 to 6-11, and $Z_2$ is an acid anhydride residual group or acid dianhydride residual group.

[Chemical Formula 6-1]

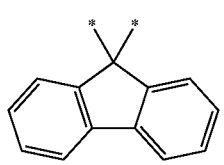

[Chemical Formula 6-2]

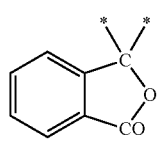

[Chemical Formula 6-3]

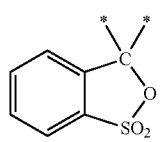

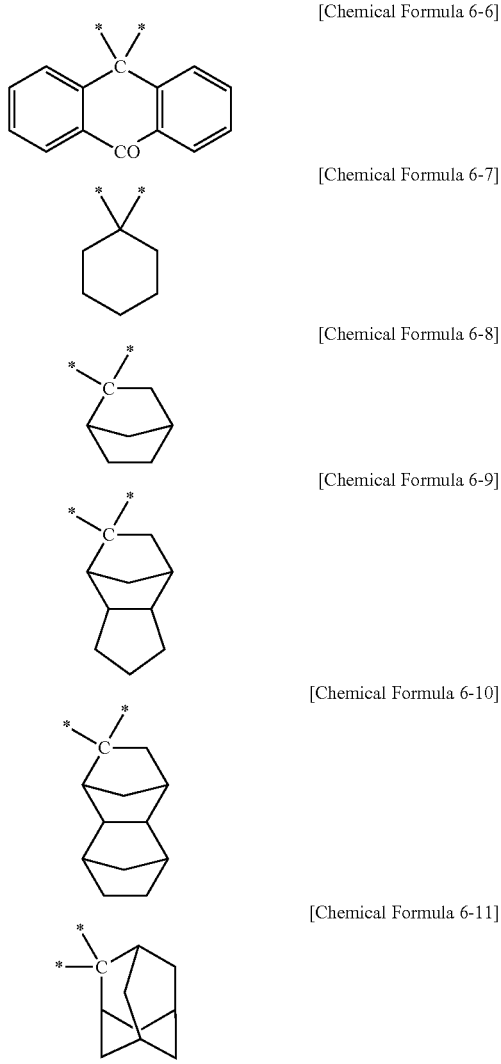

In Chemical Formula 6-5,
$R_f$ is hydrogen, ethyl, $C_2H_4Cl$, $C_2H_4OH$, $CH_2CH=CH_2$, or phenyl.

The cardo-based resin may have a weight average molecular weight of about 1,000 to about 20,000 g/mol.

The acrylic-based resin may include a copolymer of a first ethylenic unsaturated monomer and a second ethylenic unsaturated monomer. Examples of the first ethylenic unsaturated monomer include without limitation (meth)acrylic acids, maleic acid, itaconic acid, fumaric acid, and the like, and combinations thereof. Examples of the second ethylenic unsaturated monomer include without limitation styrene, α-methylstyrene, vinyltoluene, vinylbenzylmethylether, methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, 2-aminoethyl(meth)acrylate, 2-dimethylaminoethyl(meth)acrylate, vinyl acetate, vinyl benzoate, glycidyl(meth)acrylate, (meth)acrylonitrile, (meth)acrylamide, and the like, and combinations thereof.

The photosensitive resin composition may further include one or more additives such as but not limited to malonic acid; 3-amino-1,2-propanediol; a silane-based coupling agent including a vinyl group or a (meth)acryloxy group; a leveling agent; a fluorine-based surfactant; a radical polymerization initiator; or a combination thereof.

According to another embodiment of the present invention, a color filter manufactured using the photosensitive resin composition is provided.

Hereinafter, embodiments will be described in detail.

The photosensitive resin composition can have excellent sensitivity, fine line-forming properties, heat resistance, chemical resistance, close contacting properties, developability, and pattern characteristics, and thus it may be useful in the production of a color filter.

DETAILED DESCRIPTION

Figure 1:
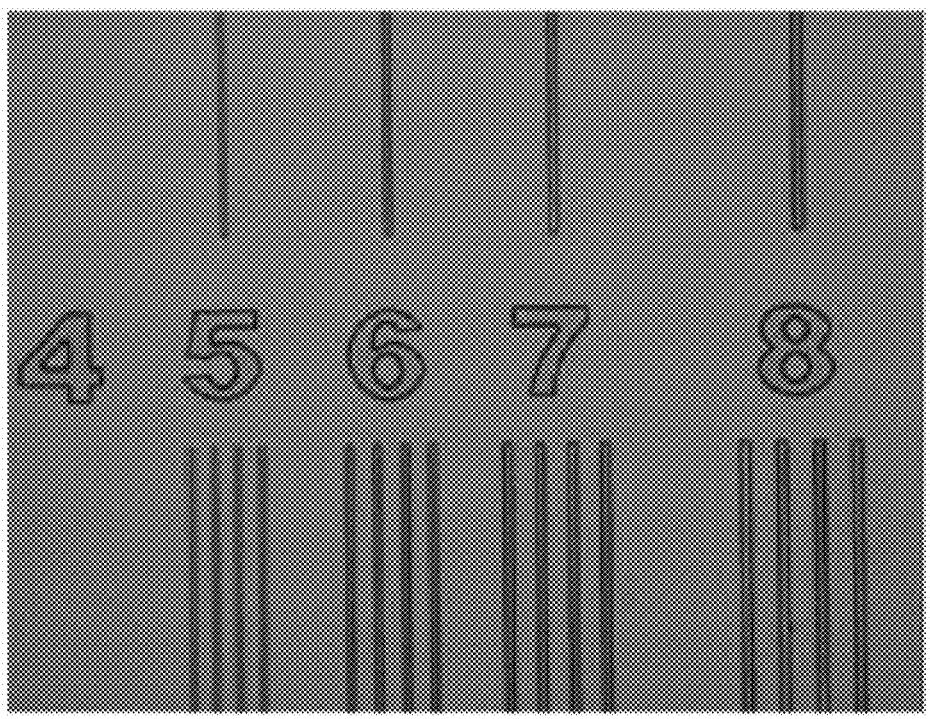
FIG. 1 is an optical microscope photograph illustrating the size of a pattern obtained from the photosensitive resin composition according to Example 1.

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to one substituted with a substituent including halogen (F, Cl, Br or I), hydroxyl, C1 to C20 alkoxy, nitro, cyano, amine, imino, azido, amidino, hydrazino, hydrazono, carbonyl, carbamyl, thiol, ester, ether, carboxyl or a salt thereof, sulfonic acid or a salt thereof, phosphoric acid or a salt thereof, C1 to C20 alkyl, C2 to C20 alkenyl, C2 to C20 alkynyl, C6 to C30 aryl, C3 to C20 cycloalkyl, C3 to C20 cycloalkenyl, C3 to C20 cycloalkynyl, C2 to C20 heterocycloalkyl, C2 to C20 heterocycloalkenyl, C2 to C20 heterocycloalkynyl, C3 to C30 heteroaryl, or a combination thereof, in place of at least one hydrogen.

As used herein, when a specific definition is not otherwise provided, the term "hetero" may refer to at least one heteroatom including N, O, S, P, or a combination thereof in a cyclic group.

As used herein, when a specific definition is not otherwise provided, "(meth)acrylate" refers to both "acrylate" and "methacrylate", and "(meth)acrylic acid" refers to both "acrylic acid" and "methacrylic acid".

The photosensitive resin composition according to one embodiment includes (A) a photopolymerizable monomer, (B) a binder resin, (C) a photopolymerization initiator, (D) a pigment, and (E) a solvent.

Hereinafter, each component is described in detail.

(A) Photopolymerizable Monomer

The photopolymerizable monomer may include a compound represented by the following Chemical Formula 1.

[Chemical Formula 1]

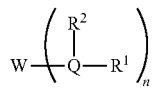

In Chemical Formula 1, W is a structure represented by the following Chemical Formulae 2-1 to 2-4, but is not limited thereto.

[Chemical Formula 2-1]

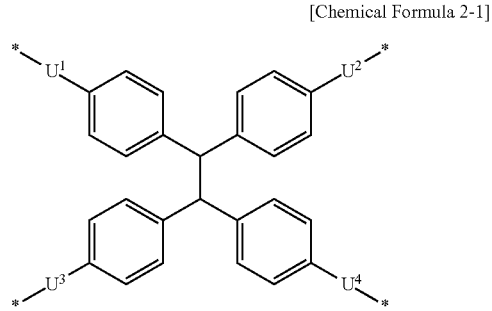

[Chemical Formula 2-2]

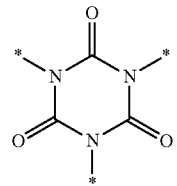

[Chemical Formula 2-3]

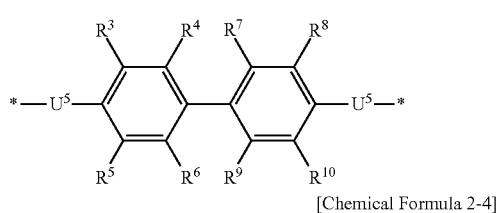

[Chemical Formula 2-4]

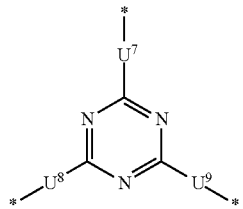

In Chemical Formulae 2-1 to 2-4, $U^1$ to $U^9$ are the same or different and are independently O, NH, S or NR' (wherein R' is substituted or unsubstituted C1 to C20 alkylene or substituted or unsubstituted C6 to C30 arylene), and $R^3$ to $R^{10}$ are the same or different and are independently hydrogen, halogen, substituted or unsubstituted C1 to C20 alkyl, or substituted or unsubstituted C6 to C30 aryl, but are not limited thereto.

In Chemical Formula 1, Q is substituted or unsubstituted C1 to C20 alkylene, substituted or unsubstituted C2 to C20 alkenylene, substituted or unsubstituted C2 to C20 alkynylene, substituted or unsubstituted C3 to C30 cycloalkylene, substituted or unsubstituted C3 to C30 cycloalkenylene, substituted or unsubstituted C3 to C30 cycloalkynylene, or substituted or unsubstituted C6 to C30 arylene, but is not limited thereto.

In Chemical Formula 1, $R^1$ is substituted or unsubstituted (meth)acrylate or substituted or unsubstituted azide, but is not limited thereto. In one embodiment, $R^1$ is substituted or unsubstituted (meth)acrylate.

In Chemical Formula 1, $R^2$ is hydrogen, hydroxyl, or a substituent represented by the following Chemical Formulae 3-1 to 3-8, but is not limited thereto. In one embodiment, $R^2$ is hydroxyl or a substituent represented by the following Chemical Formulae 3-1 to 3-8.

[Chemical Formula 3-1]

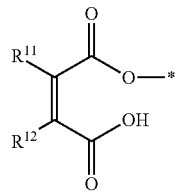

In Chemical Formula 3-1, $R^{11}$ and $R^{12}$ are the same or different and are independently hydrogen, substituted or unsubstituted C1 to C20 alkyl, ester, or ether.

[Chemical Formula 3-2]

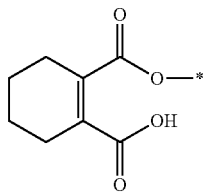

[Chemical Formula 3-3]

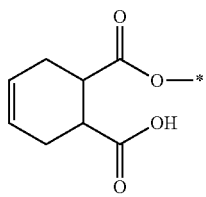

[Chemical Formula 3-4]

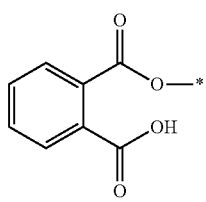

[Chemical Formula 3-5]

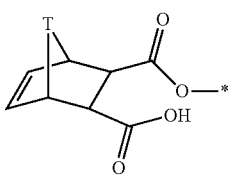

In Chemical Formula 3-5, T is O, S, NH, substituted or unsubstituted C1 to C20 alkylene, substituted or unsubstituted C1 to C20 alkylamine, or substituted or unsubstituted C1 to C20 alkylamine.

[Chemical Formula 3-6]

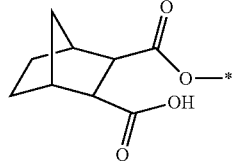

[Chemical Formula 3-7]

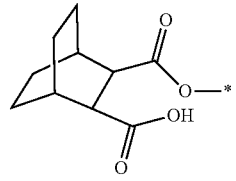

[Chemical Formula 3-8]

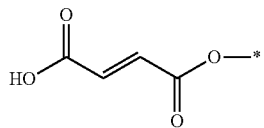

In Chemical Formula 1, n may be an integer of 2 to 4

Examples of the photopolymerizable monomer may include one of the compounds represented by the following Chemical Formulae 4-1 to 4-4, or a combination thereof, but are not limited thereto.

[Chemical Formula 4-1]

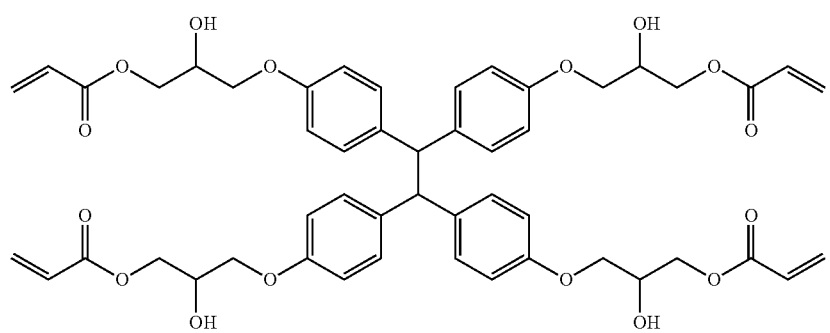

[Chemical Formula 4-2]

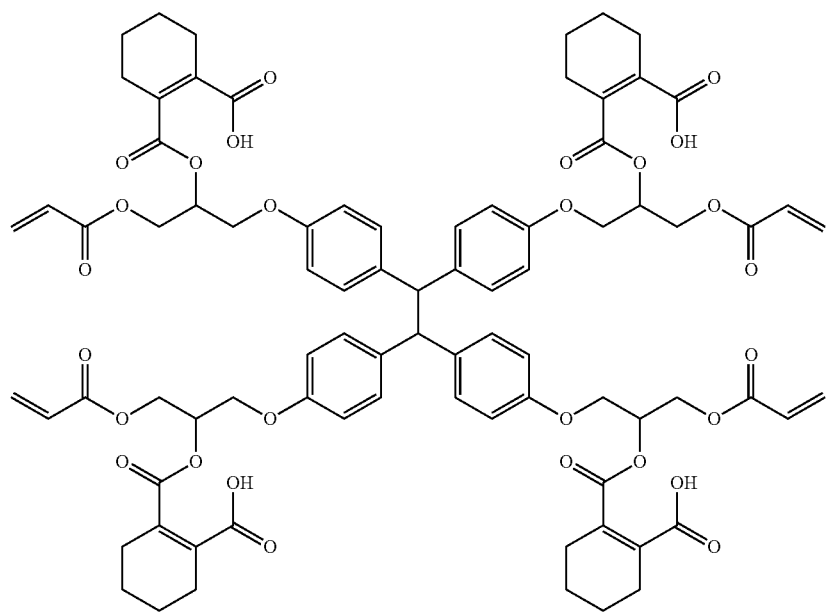

[Chemical Formula 4-3]

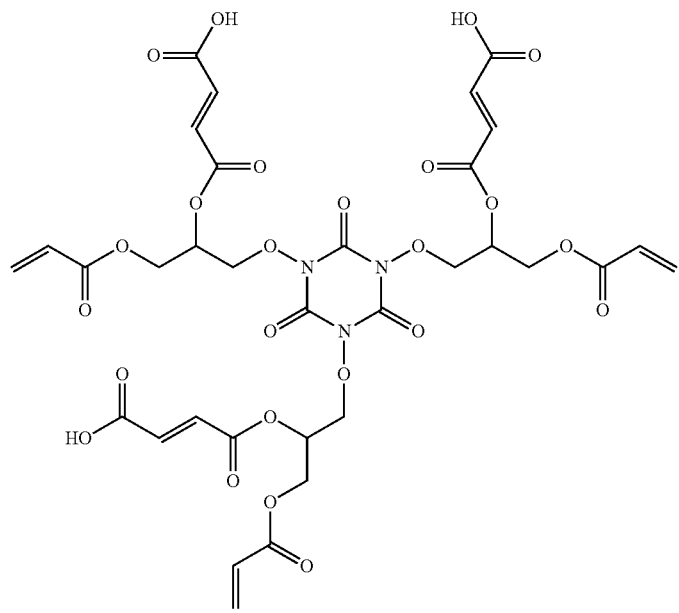

[Chemical Formula 4-4]

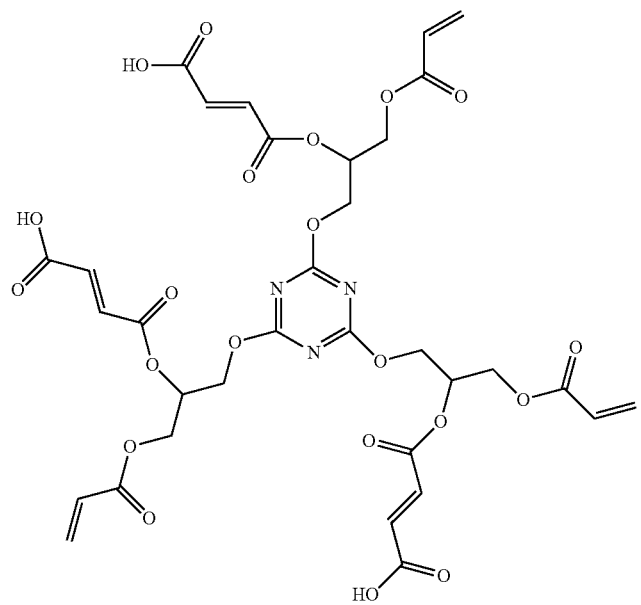

The photopolymerizable monomer includes at least two double bonds therein, which can improve sensitivity during pattern formation.

The photopolymerizable monomers (A) can be produced by reacting suitable starting materials, such as but not limited to an epoxy containing compound and acylic acid; or an epoxy containing compound, acylic acid and acid dianhydride, to provide a compound with the functional groups W, Q, $R^1$ and $R^2$. Suitable starting materials are commercially available and/or can be readily synthesized by the skilled artisan.

Exemplary epoxy containing compounds may include without limitation compounds represented by the following Chemical Formulae 7-1 to 7-3, and combinations thereof:

[Chemical Formula 7-1]

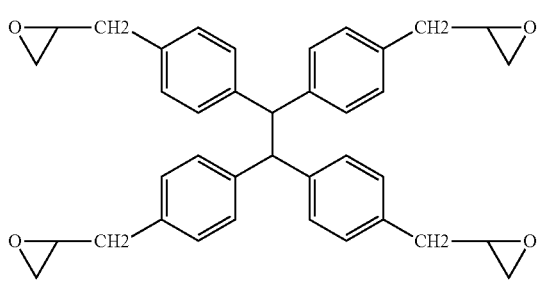

-continued

[Chemical Formula 7-2]

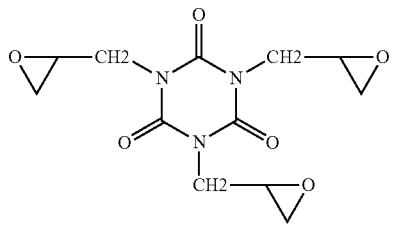

and

[Chemical Formula 7-3]

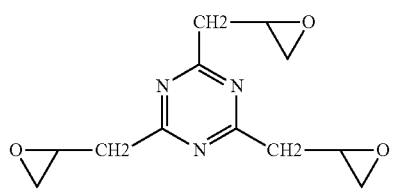

The examples below also illustrate non-limiting exemplary starting materials and reaction conditions suitable for making the photopolymerizable monomers (A). The skilled artisan will understand and appreciate how to make the photopolymerizable monomers (A), including the selection of suitable starting materials and reaction conditions, without undue experimentation.

The photopolymerizable monomer may further include a reactive unsaturated compound as well as the compound represented by Chemical Formula 1.

The reactive unsaturated compound may be a mono-functional or multi-functional ester of (meth)acrylic acid including at least one ethylenic unsaturated double bond.

Examples of the reactive unsaturated compound may include without limitation ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolacepoxy (meth)acrylate, and the like, and combinations thereof.

The reactive unsaturated compound may be treated with acid anhydride to improve developability.

The compound represented by Chemical Formula 1 and the reactive unsaturated compound may be mixed at a weight ratio of about 1:99 to about 99:1, for example a weight ratio of about 5:95 to about 95:5.

In some embodiments, the mixture of the compound represented by Chemical Formula 1 and the reactive unsaturated compound may include the compound represented by Chemical Formula 1 in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 wt %. Further, according to some embodiments of the present invention, the amount of the compound represented by Chemical Formula 1 can be in a range from about any of the foregoing amounts to about any other of the foregoing amounts.

In some embodiments, the mixture of the compound represented by Chemical Formula 1 and the reactive unsaturated compound may include the reactive unsaturated compound in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 wt %. Further, according to some embodiments of the present invention, the amount of the reactive unsaturated compound can be in a range from about any of the foregoing amounts to about any other of the foregoing amounts.

When the compound represented by Chemical Formula 1 and the reactive unsaturated compound are mixed in an amount within the above weight ratio, high sensitivity may be provided, and thus excellent heat resistance and chemical resistance may be provided.

The photosensitive resin composition may include the photopolymerizable monomer in an amount ranging from about 0.1 to about 30 wt %, for example about 1 to about 20 wt %, based on the total weight of the photosensitive resin composition. In some embodiments, the photosensitive resin composition may include the photopolymerizable monomer in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the photopolymerizable monomer can be in a range from about any of the foregoing amounts to about any other of the foregoing amounts. When the photopolymerizable monomer is included in an amount within the above range, the composition may exhibit sufficient curing when exposed during pattern forming processes, and may also exhibit good reliability, sensitivity, and developability for alkali development solution.

(B) Binder Resin

The binder resin may include a cardo-based resin, an acrylic-based resin, or a combination thereof.

The cardo-based resin may include a compound including a repeating unit represented by the following Chemical Formula 5.

[Chemical Formula 5]

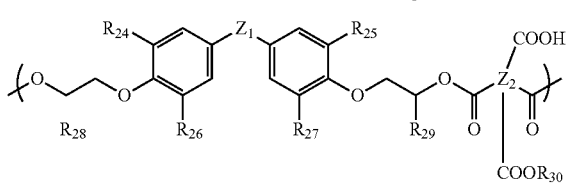

In Chemical Formula 5, $R_{24}$ to $R_{27}$ are the same or different and are independently hydrogen, halogen, or substituted or unsubstituted C1 to C20 alkyl, $R_{28}$ and $R_{29}$ are the same or different and are independently hydrogen, or $CH_2OR_a$ (wherein $R_a$ is a vinyl group, an acrylic group, or a methacrylic group), $R_{30}$ is hydrogen, substituted or unsubstituted C1 to C20 alkyl, substituted or unsubstituted C2 to C20 alkenyl, an acrylic group, or a methacrylic group, $Z_1$ is a single bond, O, CO, $SO_2$, $CR_bR_c$, $SiR_dR_e$ (wherein $R_b$ to $R_e$ are the same or different and are independently hydrogen or substituted or unsubstituted C1 to C20 alkyl), or a linking group represented by the following Chemical Formulae 6-1 to 6-11, and $Z_2$ is an acid anhydride residual group or acid dianhydride residual group.

[Chemical Formula 6-1]

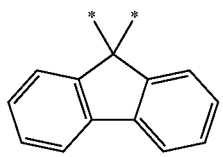

[Chemical Formula 6-2]

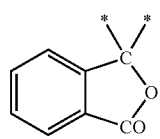

[Chemical Formula 6-3]

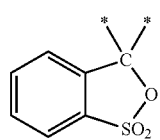

[Chemical Formula 6-4]

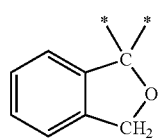

[Chemical Formula 6-5]

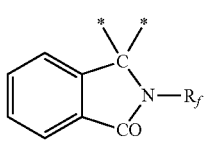

In Chemical Formula 6-5, $R_f$ is hydrogen, ethyl, $C_2H_4Cl$, $C_2H_4OH$, $CH_2CH=CH_2$, or phenyl.

[Chemical Formula 6-6]

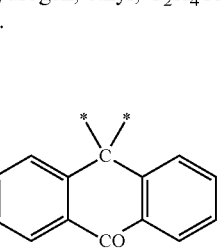

[Chemical Formula 6-7]

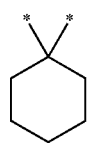

[Chemical Formula 6-8]

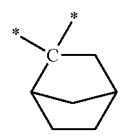

[Chemical Formula 6-9]

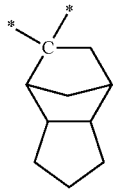

[Chemical Formula 6-10]

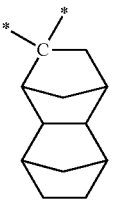

[Chemical Formula 6-11]

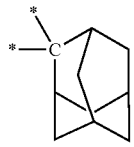

The cardo-based resin may be obtained by reacting the compound represented by the following Chemical Formula 7 and tetracarboxylic dianhydride.

[Chemical Formula 7]

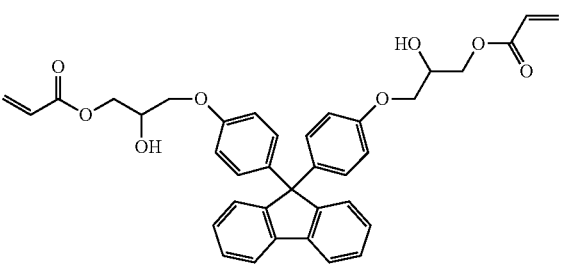

Examples of the tetracarboxylic acid dianhydride may include without limitation an aromatic tetracarboxylic acid dianhydride. Examples of the aromatic tetracarboxylic acid dianhydride may include without limitation pyromellic dianhydride, 3,3',4,4'-biphenyltetracarboxylic acid dianhydride, 2,3,3',4-biphenyltetracarboxylic acid dianhydride, 2,2',3,3'-biphenyltetracarboxylic acid dianhydride, 3,3',4,4'-benzophenonetetracarboxylic acid dianhydride, 3,3',4,4'-biphenylethertetracarboxylic acid dianhydride, 3,3',4,4'-diphenylsulfonetetracarboxylic acid dianhydride, 1,2,3,4-cyclopentanetetracarboxylic acid dianhydride, 1,2,5,6-naphthalenetetracarboxylic acid dianhydride, 2,3,6,7-naphthalenetetracarboxylic acid dianhydride, 1,4,5,8-naphthalenetetracarboxylic acid dianhydride, 2,3,5,6-pyridinetetracarboxylic acid dianhydride, 3,4,9,10-perylenetetracarboxylic acid dianhydride, 2,2-bis (3,4-dicarboxylphenyl)hexafluoropropane dianhydride, and the like, and combinations thereof.

The cardo-based resin may have a weight average molecular weight of about 1,000 to about 20,000 g/mol, for example about 3,000 to about 10,000 g/mol. When the cardo-based resin has a weight average molecular weight within the above range, excellent patterning and developability during formation of a color filter may be provided.

The acrylic-based resin is a copolymer of a first ethylenic unsaturated monomer and a second ethylenic unsaturated monomer that is copolymerizable with the first ethylenic unsaturated monomer, and a resin including at least one acrylic-based repeating unit.

The first ethylenic unsaturated monomer is an ethylenic unsaturated monomer including at least one carboxyl group. Examples of the monomer include without limitation acrylic acid, (meth)acrylic acid, maleic acid, itaconic acid, fumaric acid, and the like, and combinations thereof.

The copolymer can include the first ethylenic unsaturated monomer in an amount ranging from about 5 to about 50 wt %, for example about 10 to about 40 wt %, based on the total weight of the acrylic-based resin. In some embodiments, the copolymer may include the first ethylenic unsaturated monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer may include without limitation aromatic vinyl compounds such as styrene, α-methylstyrene, vinyltoluene, vinylbenzylmethylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl (meth)acrylate, and the like; carboxylic acid vinyl ester compounds such as vinyl acetate, vinyl benzoate, and the like; unsaturated carboxylic acid glycidyl ester compounds such as glycidyl(meth)acrylate and the like; vinyl cyanide compounds such as (meth)acrylonitrile and the like; unsaturated amide compounds such as (meth)acrylamide and the like; and the like. They may be used singularly or as a mixture of two or more.

Examples of the acrylic-based resin may include without limitation a methacrylic acid/benzylmethacrylate copolymer, a methacrylic acid/benzylmethacrylate/styrene copolymer, a methacrylic acid/benzylmethacrylate/2-hydroxyethylmethacrylate copolymer, a methacrylic acid/benzylmethacrylate/styrene/2-hydroxyethylmethacrylate copolymer, and the like. They may be used singularly or as a mixture of two or more.

The acrylic-based resin may have a weight average molecular weight ranging from about 33,000 to about 150,000 g/mol, for example about 5,000 to about 50,000 g/mol, and as another example about 2,000 to about 30,000 g/mol. When the acrylic-based resin has a weight average molecular weight within the above range, the photosensitive resin composition can have good physical and chemical properties, appropriate viscosity, and close contacting (adhesive) properties with a substrate when used in a color filter.

The acrylic-based resin may have an acid value ranging from about 15 to about 60 mgKOH/g, for example about 20 to about 50 mgKOH/g. When the acrylic-based resin has an acid value within the above range, the composition may provide excellent pixel resolution.

The cardo-based resin and acrylic-based resin may be mixed at a weight ratio of about 1:99 to about 99:1. In some embodiments, the mixture of the cardo-based resin and acrylic-based resin may include the cardo-based resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 wt %. Further, according to some embodiments of the present invention, the amount of the cardo-based resin in the mixture of the cardo-based resin and acrylic-based resin can be in a range from about any of the foregoing amounts to about any other of the foregoing amounts.

In some embodiments, the mixture of the cardo-based resin and acrylic-based resin may include the acrylic-based resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 wt %. Further, according to some embodiments of the present invention, the amount of the acrylic-based resin in the mixture of the cardo-based resin and acrylic-based resin can be in a range from about any of the foregoing amounts to about any other of the foregoing amounts.

When the cardo-based resin and acrylic-based resin are included in the above weight ratio, the composition may exhibit excellent developability and may provide a color filter pattern having excellent pattern-forming ability while inhibiting undercut generation.

The photosensitive resin composition may include the binder resin in an amount of about 1 to about 30 wt %, for example about 3 to about 20 wt %, based on the total weight of the photosensitive resin composition. In some embodiments, the photosensitive resin composition may include the binder resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the binder resin can be in a range from about any of the foregoing amounts to about any other of the foregoing amounts.

When the binder resin is included in an amount within the above range, the viscosity of the photosensitive resin composition may be maintained appropriately to provide excellent patterning, processability, and developability during color filter formation.

(C) Photopolymerization Initiator

Examples of the photopolymerization initiator may include without limitation acetophenone-based compounds, benzophenone-based compounds, thioxanthone-based compounds, benzoin-based compounds, triazine-based compounds, oxime-based compounds, and the like, and combinations thereof.

Examples of the acetophenone-based compound include without limitation 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound include without limitation benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound include without limitation 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphto-1-yl)-4,6-bis(trichloromethyl)-s-triazine, 2-(4-methoxynaphto-1-yl)-4,6-bis(trichloromethyl)-s-triazine, 2-4-tri chloromethyl(piperonyl)-6-triazine, 2-4-trichloromethyl (4'-methoxystyryl)-6-triazine, and the like, and combinations thereof.

Examples of the oxime-based compound may include without limitation 2-(o-benzoyloxime)-1-[4-(phenylthio) phenyl]-1,2-octanedione, 1-(o-acetyloxime)-1-[9-ethyl-6-(2-methylbenzoyl)-9H-carbazol-3-yl]ethanone, and the like, and combinations thereof.

The photopolymerization initiator may further include a carbazole-based compound, a diketone-based compound, a sulfonium borate-based compound, a diazo-based compound, a biimidazole-based compound, and the like, or a combination thereof.

The photosensitive resin composition may include the photopolymerization initiator in an amount of about 0.1 wt % to about 10 wt %, for example about 0.3 to about 8 wt %, based on the total weight of the photosensitive resin composition. In some embodiments, the photosensitive resin composition may include the photopolymerizable initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerizable initiator can be in a range from about any of the foregoing amounts to about any other of the foregoing amounts.

When the photopolymerization initiator is included in an amount within the above range, sufficient curing can be performed when the composition is exposed during pattern forming processes, and transmittance reduction due to non-reacting initiators may be inhibited.

(D) Pigment

The pigment may include a red pigment, a green pigment, a blue pigment, a yellow pigment, a black pigment, and the like, or a combination thereof.

Examples of the pigment may include without limitation anthraquinone-based pigments, perylene-based pigments, phthalocyanine-based pigments, azo-based pigments, carbon black, inorganic metal pigments, and the like. The pigments may be used singularly or as a mixture of two or more.

The photosensitive resin composition may further include a dispersing agent in order to improve dispersion of the pigment.

The pigment may be surface-pretreated with a dispersing agent, or the pigment and dispersing agent may be added together during preparation of the photosensitive resin composition.

The dispersing agent may include a non-ionic dispersing agent, an anionic dispersing agent, a cationic dispersing agent, and the like, or a combination thereof. Examples of the dispersing agent include without limitation polyalkylene glycols and esters thereof, polyoxyalkylenes, polyhydric alcohol ester alkylene oxide addition products, alcohol alkylene oxide addition products, sulfonic acid esters, sulfonates, carboxylic acid esters, carboxylate salts, alkylamide alkylene oxide addition products, alkyl amines, and the like. The dispersing agents may be used singularly or as a mixture of two or more.

The dispersing agent may be included in an amount of about 0.01 to about 15 wt % based on the total weight of the photosensitive resin composition. When the dispersing agent is included in an amount within the above range, dispersion of the photosensitive resin composition can be improved, which can provide excellent stability, developability, and patterning.

The pigment may have a primary particle diameter of about 10 to about 100 nm, for example about 10 to about 70 nm. When the pigment has a primary particle diameter within the above range, stability in pigment dispersion solution can be excellent and resolution of pixels may be improved.

The photosensitive resin composition may include the pigment in an amount of about 1 to about 30 wt %, for example about 3 to about 25 wt %, based on the total weight of the photosensitive resin composition. In some embodiments, the photosensitive resin composition may include the pigment in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the pigment can be in a range from about any of the foregoing amounts to about any other of the foregoing amounts.

When the pigment is included in an amount within the above range, coloring properties and developability can be improved during color filter formation.

(E) Solvent

The solvent is compatible with the photopolymerizable monomer, binder resin, photopolymerization initiator, and pigment but is not reactive therewith.

Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol methylether, ethylene glycol ethylether, propylene glycol methylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbon such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl ester such as ethyl acetate, n-butyl acetate, isobutyl acetate, and the like; lactate alkyl esters such as methyl lactate, ethyl lactate, and the like; alkyl hydroxy acetate ester such as methyl hydroxyacetate, ethyl hydroxyacetate, butyl hydroxyacetate, and the like; alkoxyalkyl acetate esters such as methoxymethyl acetate, methoxyethyl acetate, methoxybutyl acetate, ethoxymethyl acetate, ethoxyethyl acetate, and the like; alkyl 3-hydroxypropionate ester such as methyl 3-hydroxypropionate, ethyl 3-hydroxypropionate, and the like; alkyl 3-alkoxypropionate esters such as methyl 3-methoxypropionate, ethyl 3-methoxypropionate, ethyl 3-ethoxypropionate, methyl 3-ethoxypropionate, and the like; alkyl 2-hydroxypropionate ester such as methyl 2-hydroxypropionate, ethyl 2-hydroxypropionate, propyl 2-hydroxypropionate, and the like; alkyl 2-alkoxypropionate ester such as methyl 2-methoxypropionate, ethyl 2-methoxypropionate, ethyl 2-ethoxypropionate, methyl 2-ethoxypropionate, and the like; alkyl 2-hydroxy-2-methylpropionate esters such as methyl 2-hydroxy-2-methylpropionate, ethyl 2-hydroxy-2-methylpropionate, and the like; alkyl 2-alkoxy-2-methylpropionate esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate, and the like; or ketonate esters such as ethyl pyruvate, and the like. Additionally, the following solvents may be also used: N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like. These solvents may be used singularly or as a mixture of two or more.

Taking into consideration miscibility and reactivity, the solvent can include glycol ethers such as ethylene glycol monoethylether, and the like; ethylene glycol alkylether acetates such as ethyl cellosolve acetate, and the like; esters such as 2-hydroxy ethyl propionate, and the like; diethylene glycols such as diethylene glycol monomethylether, and the like; propylene glycol alkylether acetates such as propylene glycol methylether acetate, propylene glycol propylether acetate, and the like, and combinations thereof.

The solvent can be used in a balance amount. In exemplary embodiments, the photosensitive resin composition can include the solvent in an amount of about 50 to about 85 wt %, based on the total weight of the photosensitive resin composition. In some embodiments, the photosensitive resin composition for a color filter may include the solvent in an amount of about 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, or 85 wt %. Further, according to some embodiments of the present invention, the amount of the solvent can be in a range from about any of the foregoing amounts to about any other of the foregoing amounts. When the solvent is included in an amount within the above range, the photosensitive resin composition may have an appropriate viscosity which can improve processibility of a color filter.

(F) Other Additive(s)

The photosensitive resin composition may include one or more other additives such as but not limited to malonic acid; 3-amino-1,2-propanediol; a silane-based coupling agent including a vinyl group or a (meth)acryloxy group; a leveling agent; a fluorine-based surfactant; a radical polymerization initiator, and the like, and combinations thereof, in order to prevent a stain or a spot during the coating and generation of a residue due to non-development and to control leveling.

Examples of the silane-based coupling agent may include without limitation trimethoxysilyl benzoate, γ-methacryloxypropyl trimethoxysilane, vinyl triacetoxysilane, vinyl trimethoxysilane, γ-isocyanate propyl triethoxysilane, γ-glycidoxy propyl trimethoxysilane, β-(3,4-epoxycyclohexyl)ethyltrimethoxysilane, and the like, and combinations thereof.

Examples of the fluorine-based surfactant may include without limitation BM-1000® and BM-1100® (BM Chemie Inc.); MEGAFACE F 142D®, F 172®, F 173®, and F 183® (Dainippon Ink & Chemicals(DIC), Inc.); FULORAD FC-135®, FULORAD FC-170C®, FULORAD FC-430®, and FULORAD FC-431® (Sumitomo 3M Co., Ltd.); SURFLON S-112®, SURFLON S-113®, SURFLON S-131®, SURFLON S-141®, and SURFLON S-145® (Asahi Glass Co., Ltd.); and SH-28PA®, SH-190®, SH-193®, SZ-6032®, and SF-8428®, and the like (Toray Silicone Co., Ltd.), and combinations thereof.

These additives may be included in an adjusted amount depending on desired properties.

The photosensitive resin composition may further include an epoxy compound in order to improve close contacting properties with a substrate.

Examples of the epoxy compound include without limitation phenol novolac epoxy compounds, tetramethyl biphenyl epoxy compounds, bisphenol A epoxy compounds, alicyclic epoxy compounds, and the like, and combinations thereof.

The photosensitive resin composition may include the epoxy compound in an amount of about 0.01 to about 5 parts by weight, for example about 0.1 to about 5 parts by weight, based on about 100 parts by weight of the photosensitive resin composition. When the epoxy compound is included in an amount within the above range, close contacting properties, heat resistance, and chemical resistance may be improved.

According to another embodiment, a color filter manufactured using the photosensitive resin composition is provided. The color filter can be manufactured as follows.

The photosensitive resin composition can be coated to a thickness of about 3.1 to about 3.4 μm on a bare glass substrate or a glass substrate having an about 500 Å to about 1500 Å thick $SiN_x$ layer (protective layer) thereon by a method such as but not limited to spin coating, slit coating, and the like. After coating, the layer can be exposed to radiation (irradiated by light) to form a pattern required for a color filter. When the coating layer is treated with an alkali development solution to dissolve the non-radiated part, a pattern for a color filter is formed. This process can be repeated as many times as necessary, depending on the numbers of colors of R, G, B and a light blocking layer, needed to provide a color filter with a desired pattern.

In this process, the developed image pattern can be heated or cured by actinic rays to improve crack resistance, solvent resistance, and the like.

In general, since a negative photosensitive resin is not easily stripped by an organic solvent, its residue may contaminate a lower layer. In addition, it can have a weaker close contacting property (adhesion) to a lower layer than a positive photosensitive resin, increasing an undercut thereof. According to exemplary embodiments of the invention, a photosensitive resin composition for a color filter may improve stripper resistance of such a negative photosensitive resin, may inhibit contamination of a lower layer, and may improve close contacting property with a lower layer.

The following examples illustrate the present invention in more detail. However, it is understood that the present invention is not limited by these examples.

Preparation Example 1-1

Synthesis of Photopolymerizable Monomer

A compound represented by the following Chemical Formula 4-1, which is 1,1,2,2-tetrakis[4-(2-hydroxy-3-acryloyloxy)propoxy)phenyl]ethane, is synthesized by adding 186.3 g of TEP-G produced by Asahi Organic Chemicals Industries Co., Ltd., 54 g of acrylic acid, 128 g of propylene glycol methylethyl acetate (produced by Daicel Chemical Industries, Ltd.), 1 g of triphenylphosphine (produced by Aldrich), 1.4 g of benzyltriethylammoniumchloride (produced by Daejung Chemicals & Metals Co., Ltd.) and 0.5 g of hydroquinone into a reactor, heating the mixture up to 120° C., and allowing it to stand still for 12 hours.

[Chemical Formula 4-1]

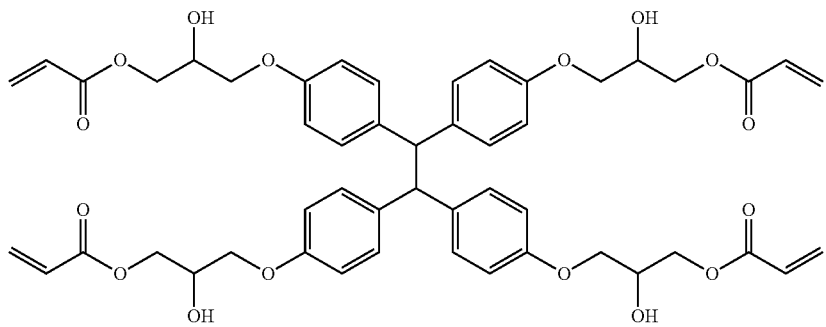

Preparation Example 1-2

Synthesis of Photopolymerizable Monomer

A compound represented by the following Chemical Formula 4-2 is synthesized by adding 60 g of a compound represented by the above Chemical Formula 4-1, 23.65 g of 3,4,5,6-tetrahydrophthanhydride (produced by Aldrich), and 20 g of propylene glycol methylethyl acetate (produced by Daicel Chemical Industries, Ltd.) into a reactor, heating the mixture up to 120° C., and allowing it to stand still for two hours.

Preparation Example 1-3

Synthesis of Photopolymerizable Monomer

A compound represented by the following Chemical Formula 4-3 is synthesized by adding 100 g of triglycidyl isocyanurate, 63 g of acrylic acid, 250 g of propyleneglycol methylethyl acetate (produced by Daicel Chemical Industries, Ltd.), 1 g of triphenylphosphine (produced by Aldrich), 1 g of benzyltriethylammoniumchloride (produced by Daejung Chemicals & Metals Co., Ltd.) and 0.5 g of hydroquinone into a reactor, heating the mixture up to 120° C., allowing it to stand still for 12 hours, cooling it down to 50° C., adding 86 g of maleic anhydride, and agitating the mixture.

[Chemical Formula 4-2]

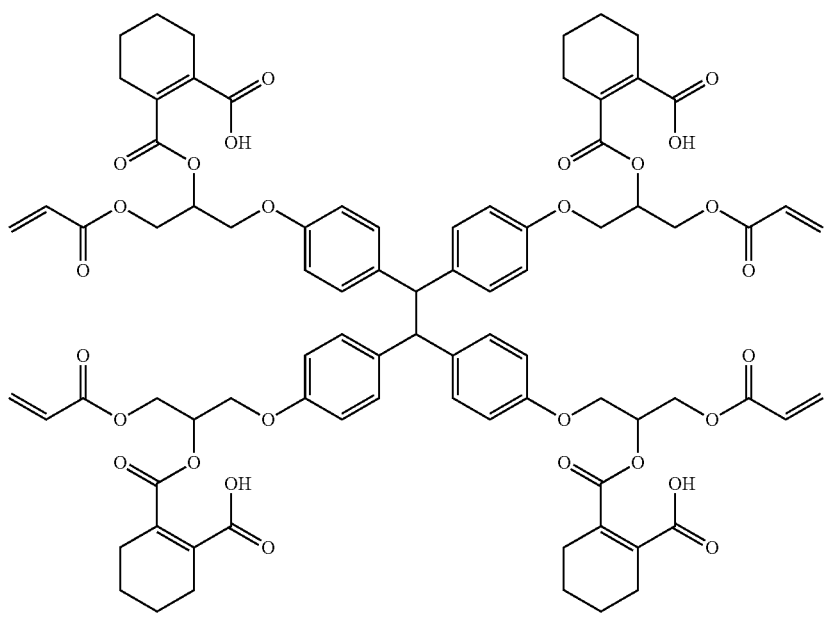

[Chemical Formula 4-3]

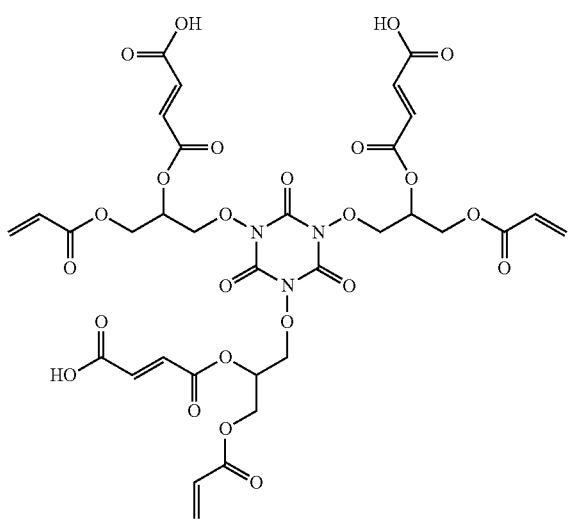

Preparation Example 1-4

Synthesis of Photopolymerizable Monomer

A compound represented by the following Chemical Formula 4-4 is synthesized by adding 100 g of 2,4,6-tris(glycidyl)-1,3,5-triazine, 73 g of acrylic acid, 275 g of propylene glycol methylethyl acetate (produced by Daicel Chemical Industries, Ltd.), 1 g of triphenylphosphine produced by Aldrich), 1 g of benzyltriethylammoniumchloride (produced by Daejung Chemicals & Metals Co., Ltd.) and 0.5 g of hydroquinone into a reactor, heating the mixture up to 120° C., allowing it to stand still for 12 hours, cooling it down to 50° C., adding 100 g of maleic anhydride to the mixture, and agitating the mixture.

[Chemical Formula 4-4]

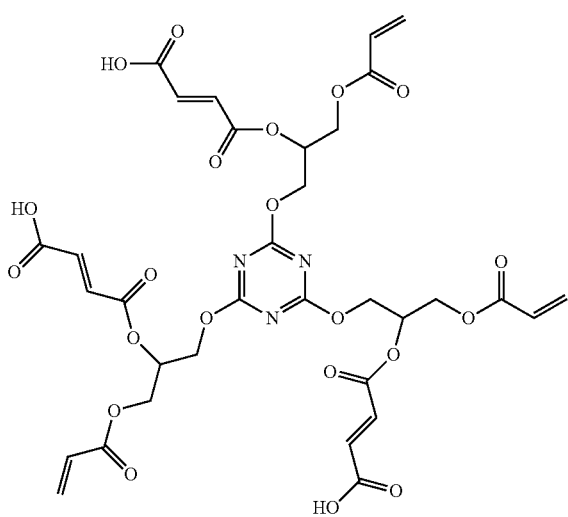

Preparation Example 2

Preparation of Red Pigment Dispersion Solution

A red pigment dispersion solution is prepared by adding 15 g of C.I. red pigment 254 (produced by Ciba), 4 g of DISPERBYK-163 (produced by BYK), 3 g of acrylic acid/benzylmethacrylate copolymer (produced by Miwon Commercial Co., Ltd., NPR8000) and 78 g of propylene glycol methyl ether acetate into a reactor, and dispersing the mixture for 12 hours with a paint-shaker (produced by Asada Iron Works. Co., Ltd.).

Preparation Example 3

Preparation of Red Pigment Dispersion Solution

Black pigment dispersion solution is prepared by adding 15 g of carbon black (produced by Cabot Corporation), 4 g of DISPERBYK-163 (produced by BYK), 3 g of acrylic acid/benzylmethacrylate copolymer (Miwon Commercial Co., Ltd., NPR8000), and 78 g of propylene glycol methyl ether acetate into a reactor, and dispersing the mixture for 12 hours with a paint-shaker (produced by Asada Iron Works. Co., Ltd.).

Examples 1 to 8 and Comparative Examples 1 and 2

Preparation of Photosensitive Resin Compositions

Photosensitive resin compositions according to Examples 1 to 8 and Comparative Examples 1 and 2 are prepared for the compositions shown in the following Table 1.

In particular, an initiator is dissolved in a solvent and agitated at a room temperature for 2 hours, and the photopolymerizable monomers prepared according to Preparation Examples 1-1 to 1-4 and a binder resin are added thereto and agitated at a room temperature for 2 hours. Subsequently, the red pigment dispersion solution prepared according to Preparation Example 2 or black pigment dispersion solution prepared according to Preparation Example 3 and a silane coupling agent are added to the acquired reactant, and agitated at a room temperature for one hour. Subsequently, the product is filtrated three times to remove impurity to thereby complete the preparation of a photosensitive resin composition.

(A) Photopolymerizable Monomer
(A-1) The compound represented by Chemical Formula 4-1 prepared in Preparation Example 1-1 is used.
(A-2) The compound represented by Chemical Formula 4-2 prepared in Preparation Example 1-2 is used.
(A-3) The compound represented by Chemical Formula 4-3 prepared in Preparation Example 1-3 is used.
(A-4) The compound represented by Chemical Formula 4-4 prepared in Preparation Example 1-4 is used.
(A-5) Dipentaerythritol hexaacrylate as a reactive unsaturated compound is used.
(B) Binder Resin
V259ME produced by Nippon Steel Corporation is used as a cardo-based resin.
(C) Photopolymerization Initiator
IRGACURE OXE02 produced by Ciba-Geigy Corporation is used.
(D) Pigment Dispersion Solution
(D-1) The red pigment dispersion solution prepared according to Preparation Example 2 is used. Herein, pigment solids are included in an amount of 15 wt % based on the total amount of the red pigment dispersion solution.

(D-2) Black pigment dispersion solution prepared according to the Preparation Example 3 is used. Herein, pigment solids are included in an amount of 15 wt % based on the total amount of the black pigment dispersion solution.

(E) Solvent

Propylene glycol methylether acetate was used.

(F) Additive

As a silane coupling agent, γ-glycidoxy propyl trimethoxysilane (Chisso, S-510) and surfactant (produced by DIC Inc., F-475) are used.

Figure 2:
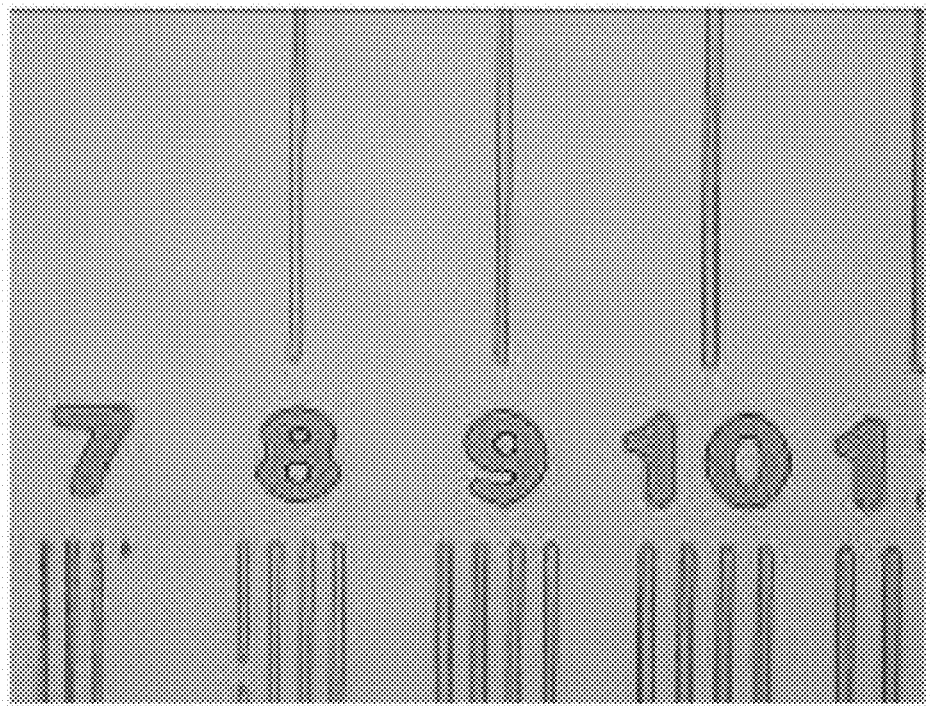
FIG. 2 is an optical microscope photograph illustrating the size of a pattern obtained from the photosensitive resin composition according to Comparative Example 1.

Referring to FIGS. 1 and 2, the minimum pattern size is 5 μm for Example 1, and the minimum pattern size is 7 μm for Comparative Example 1.

Evaluation 3: Evaluation of Close Contacting Property

Patterns are formed using the same method used to evaluate developability using the photosensitive resin compositions prepared according to Examples 1 to 8 and Comparative Examples 1 and 2, and glass substrates with the pattern formed thereon are put into a chamber where the temperature is maintained at 85° C. and the humidity is kept at 85%, and

TABLE 1

(unit: wt %)

| | | Example | | | | | | | | Comparative Example | |
|---|---|---|---|---|---|---|---|---|---|---|---|
| | | 1 | 2 | 3 | 4 | 5 | 6 | 7 | 8 | 1 | 2 |
| (A) photopolymerizable monomer | A-1 | 1.7 | 1.7 | — | — | — | — | — | — | — | — |
| | A-2 | — | — | 1.7 | 1.7 | — | — | — | — | — | — |
| | A-3 | — | — | — | — | 1.7 | 1.7 | — | — | — | — |
| | A-4 | — | — | — | — | — | — | 1.7 | 1.7 | — | — |
| | A-5 | 1.8 | 1.8 | 1.8 | 1.8 | 1.8 | 1.8 | 1.8 | 1.8 | 3.5 | 3.5 |
| (B) binder resin | | 9.5 | 9.5 | 9.5 | 9.5 | 9.5 | 9.5 | 9.5 | 9.5 | 9.5 | 9.5 |
| (C) photopolymerization initiator | | 0.5 | 0.5 | 0.5 | 0.5 | 0.5 | 0.5 | 0.5 | 0.5 | 0.5 | 0.5 |
| (D) pigment dispersion solution | D-1 | 406* | — | 406* | — | 406* | — | 406* | — | 406* | — |
| | D-2 | — | 406* | — | 406* | — | 406* | — | 406* | — | 406* |
| (E) solvent | | 44 | 44 | 44 | 44 | 44 | 44 | 44 | 44 | 44 | 44 |
| (F) additive | | 2.5 | 2.5 | 2.5 | 2.5 | 2.5 | 2.5 | 2.5 | 2.5 | 2.5 | 2.5 |

*denotes the amount of pigment solids based on the total amount of D-1 red pigment dispersion solution or D-2 black pigment dispersion solution.

Evaluation 1: Evaluation of Pattern Forming Property

Films are formed by coating glass substrates with the photosensitive resin compositions prepared according to Examples 1 to 8 and Comparative Examples 1 and 2, respectively, and drying the films at a temperature of 90° C. for 2.5 minutes. The acquired films are radiated with light of a wavelength of 365 nm by using a pattern mask with the energy of 80 mJ/cm$^2$. Subsequently, development is performed with an aqueous solution (developing liquid) which is prepared by diluting potassium hydroxide in a concentration of 1 wt % at 23° C., and performing a rinsing process with pure water for one minute. The formed pattern substrates are heated in an oven at 230° C. for 30 minutes for solidification to thereby acquire the final pattern. After the formation of the patterns, the shape of the patterns having a height of 1.0 μm are evaluated using an optical microscope. The results are presented in the following Table 2.

<Evaluation Reference of Pattern Forming Property>

⊚: very good pattern forming property

○: good pattern forming property

Evaluation 2: Evaluation of Fine Line Pattern Forming Property

Patterns are formed using the same method used to evaluate developability and are evaluated using the photosensitive resin compositions prepared according to Examples 1 to 8 and Comparative Examples 1 and 2, and then the minimum pattern sizes of the patterns are evaluated using an optical microscope. The results are presented in the following Table 2 and FIGS. 1 and 2.

FIG. 1 is an optical microscope photograph illustrating the size of a pattern obtained from the photosensitive resin composition according to Example 1, and FIG. 2 is an optical microscope photograph illustrating the size of a pattern obtained from the photosensitive resin composition according to Comparative Example 1.

allowed to stand still for 5 hours. Then, the glass substrates are taken out of the chamber, rinsed with deionized water (DIW), and then dried. The size of the remaining fine pattern is measured by using an optical microscope, and the results are presented in the following Table 2.

TABLE 2

| | Pattern forming property | Minimum pattern size (μm) | Minimum pattern size after washing (μm) |
|---|---|---|---|
| Example 1 | ⊚ | 5 | 12 |
| Example 2 | ⊚ | 5 | 16 |
| Example 3 | ⊚ | 5 | 14 |
| Example 4 | ⊚ | 5 | 18 |
| Example 5 | ⊚ | 6 | 16 |
| Example 6 | ⊚ | 6 | 20 |
| Example 7 | ⊚ | 5 | 12 |
| Example 8 | ⊚ | 5 | 17 |
| Comparative Example 1 | ○ | 7 | 25 |
| Comparative Example 2 | ○ | 7 | 42 |

The results in Table 2 demonstrate that the photosensitive resin compositions prepared according to Examples 1 to 8 using a photopolymerizable monomer in accordance with one embodiment of this disclosure have excellent pattern forming property, compared with the photosensitive resin compositions prepared according to Comparative Examples 1 and 2 using no photopolymerizable monomer. Also, for Examples 1 to 8, the remaining minimum pattern size after rinsing appeared small compared with those of Comparative Examples 1 and 2, and the results further demonstrate that the compositions of the invention also exhibit excellent good adhesion (close contacting property).

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition, comprising:
(A) a photopolymerizable monomer including the compound represented by the following Chemical Formula 1;
(B) a binder resin comprising a cardo-based resin;
(C) a photopolymerization initiator;
(D) a pigment; and
(E) a solvent;

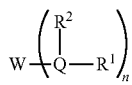

[Chemical Formula 1]

wherein, in Chemical Formula 1,

W is a structure represented by the following Chemical Formulae 2-2 to 2-4,

Q is substituted or unsubstituted C1 to C20 alkylene, substituted or unsubstituted C2 to C20 alkenylene, substituted or unsubstituted C2 to C20 alkynylene, substituted or unsubstituted C3 to C30 cycloalkylene, substituted or unsubstituted C3 to C30 cycloalkenylene, substituted or unsubstituted C3 to C30 cycloalkynylene, or substituted or unsubstituted C6 to C30 arylene, $R^1$ is substituted or unsubstituted (meth)acrylate or substituted or unsubstituted azide, $R^2$ is hydrogen, hydroxyl, or a substituent represented by the following Chemical Formulae 3-1 to 3-8, and n is an integer ranging from 2 to 3:

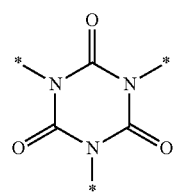

[Chemical Formula 2-2]

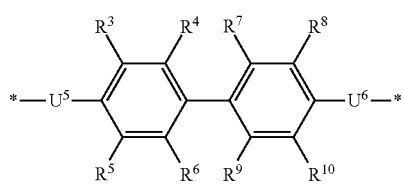

[Chemical Formula 2-3]

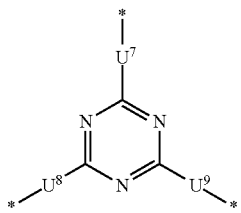

[Chemical Formula 2-4]

wherein, in Chemical Formulae 2-2 to 2-4, $U^5$ to $U^9$ are the same or different and are independently O, NH, S or NR' wherein R' is substituted or unsubstituted C1 to C20 alkylene or substituted or unsubstituted C6 to C30 arylene, and $R^3$ to $R^{10}$ are the same or different and are independently hydrogen, halogen, substituted or unsubstituted C1 to C20 alkyl, or substituted or unsubstituted C6 to C30 aryl,

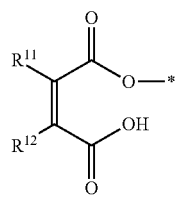

[Chemical Formula 3-1]

wherein, in Chemical Formula 3-1, $R^{11}$ and $R^{12}$ are the same or different and are independently hydrogen, substituted or unsubstituted C1 to C20 alkyl, ester, or ether,

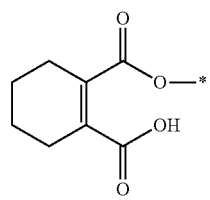

[Chemical Formula 3-2]

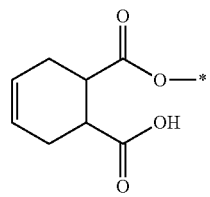

[Chemical Formula 3-3]

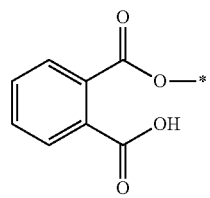

[Chemical Formula 3-4]

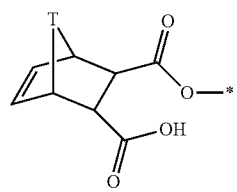

[Chemical Formula 3-5]

wherein, in Chemical Formula 3-5, T is O, S, NH, substituted or unsubstituted C1 to C20 alkylene, substituted or unsubstituted C1 to C20 alkylamine, or substituted or unsubstituted C1 to C20 allylamine,

[Chemical Formula 3-6]

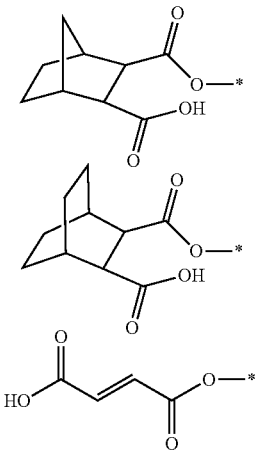

[Chemical Formula 3-7]

[Chemical Formula 3-8]

wherein the cardo-based resin comprises a compound including a repeating unit represented by the following Chemical Formula 5:

[Chemical Formula 5]

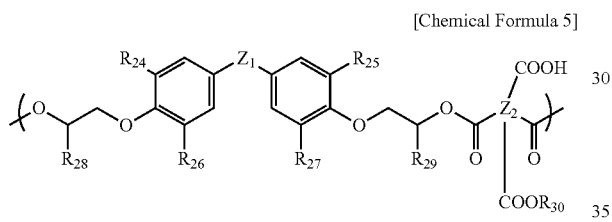

wherein, in Chemical Formula 5, $R_{24}$ to $R_{27}$ are the same or different and are independently hydrogen, halogen, or substituted or unsubstituted C1 to C20 alkyl, $R_{28}$ and $R_{29}$ are the same or different and are independently hydrogen or $CH_2OR_a$ wherein $R_a$ is a vinyl group, an acrylic group, or a methacrylic group, $R_{30}$ is hydrogen or substituted or unsubstituted C1 to C20 alkyl, $Z_1$ is a single bond, O, CO, $SO_2$, $CR_bR_c$, $SiR_dR_e$, wherein $R_b$ to $R_e$ are the same or different and are independently hydrogen or substituted or unsubstituted C1 to C20 alkyl, or a linking group represented by the following Chemical Formulae 6-1 to 6-11, and $Z_2$ is an acid anhydride residual group or acid dianhydride residual group:

[Chemical Formula 6-1]

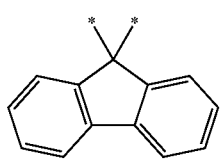

[Chemical Formula 6-2]

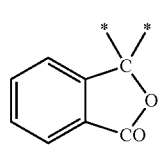

[Chemical Formula 6-3]

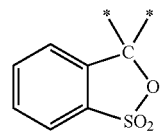

[Chemical Formula 6-4]

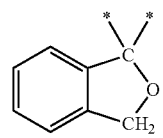

[Chemical Fromula 6-5]

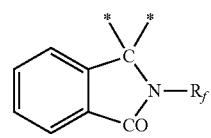

wherein, in Chemical Formula 6-5, $R_f$ is hydrogen, ethyl, $C_2H_4Cl$, $C_2H_4OH$, $CH_2CH=CH_2$, or phenyl,

[Chemical Formula 6-6]

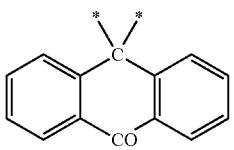

[Chemical Fromula 6-7]

[Chemical Formula 6-8]

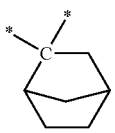

[Chemical Formula 6-9]

[Chemical Formula 6-10]

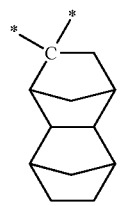

[Chemical Formula 6-11]

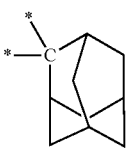

2. The photosensitive resin composition of claim 1, wherein the compound represented by Chemical Formula 1 comprises one of the compounds represented by the following Chemical Formulae 4-2 to 4-4:
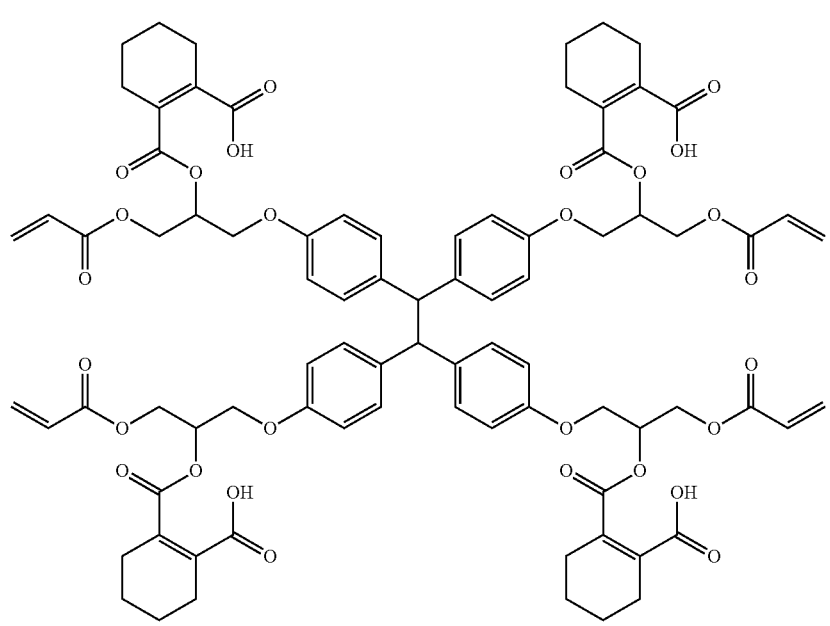
[Chemical Formula 4-2]
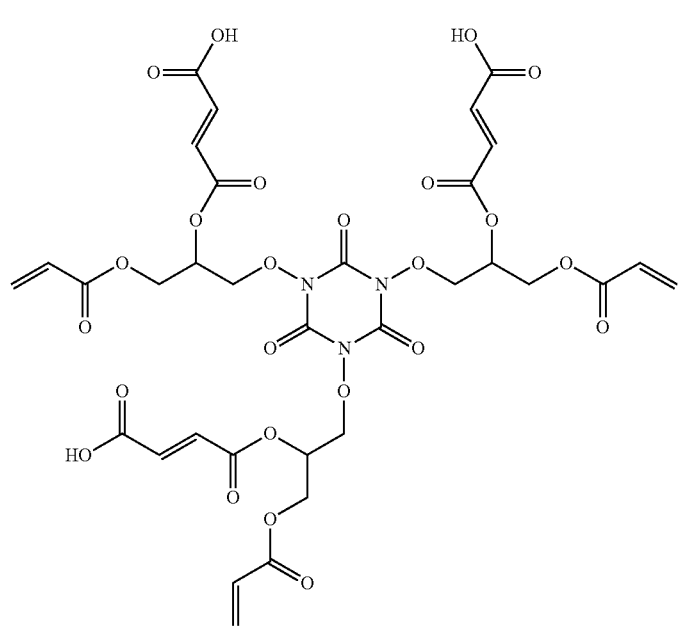
[Chemical Formula 4-3]

[Chemical Formula 4-4]

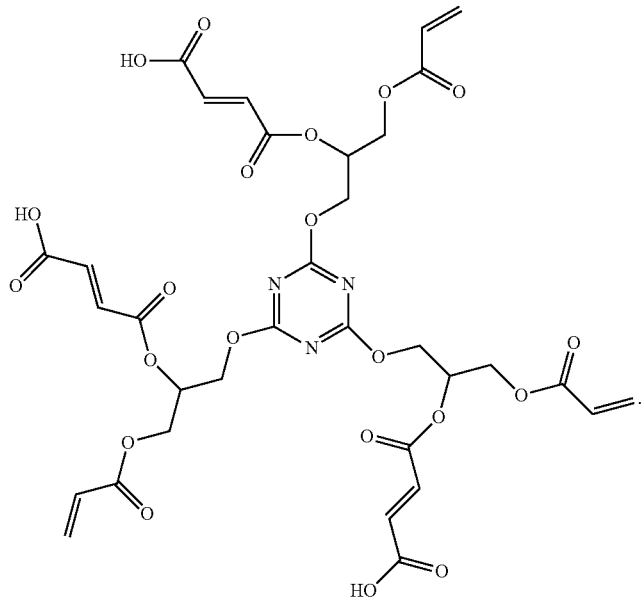

3. The photosensitive resin composition of claim 1, wherein the photosensitive resin composition comprises
about 0.1 to about 30 wt % of the photopolymerizable monomer (A);
about 1 to about 30 wt % of the binder resin (B);
about 0.1 to about 10 wt % of the photopolymerization initiator (C);
about 1 to about 30 wt % of the pigment (D); and
a balance amount of the solvent (E).

4. The photosensitive resin composition of claim 1, wherein the photopolymerizable monomer (A) further comprises a reactive unsaturated compound comprising ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenolA epoxy (meth)acrylate, ethylene glycol monomethylether (meth)acrylate, trimethylol propane tri(meth)acrylate, tris(meth)acryloyloxyethyl phosphate, novolacepoxy (meth)acrylate, or a combination thereof.

5. The photosensitive resin composition of claim 4, wherein the photopolymerizable monomer (A) comprises the compound represented by Chemical Formula 1 and the reactive unsaturated compound at a weight ratio of about 1:99 to about 99:1.

6. The photosensitive resin composition of claim 1, wherein the cardo-based resin has a weight average molecular weight of about 1,000 to about 20,000 g/mol.

7. The photosensitive resin composition of claim 1, wherein the photosensitive resin composition further comprises an additive comprising malonic acid; 3-amino-1,2-propanediol; a silane-based coupling agent including a vinyl group or a (meth)acryloxy group; a leveling agent; a fluorine-based surfactant; a radical polymerization initiator; or a combination thereof.

8. A color filter manufactured using the photosensitive resin composition of claim 1.

* * * * *

UNITED STATES PATENT AND TRADEMARK OFFICE
CERTIFICATE OF CORRECTION

PATENT NO. : 8,318,053 B2
APPLICATION NO. : 13/217581
DATED : November 27, 2012
INVENTOR(S) : Choi et al.

It is certified that error appears in the above-identified patent and that said Letters Patent is hereby corrected as shown below:

In the Specifications

Column 4, Line 16 reads "C1 to C20 alkylamine" and should read "C1 to C20 allylamine"

Column 11, Line 45 Chemical Formula 2-3 is depicted as:

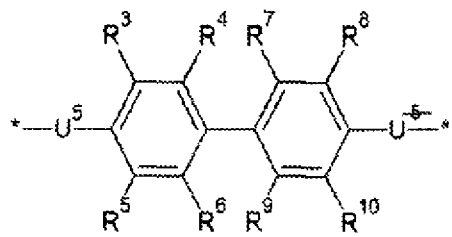

and should be depicted as:

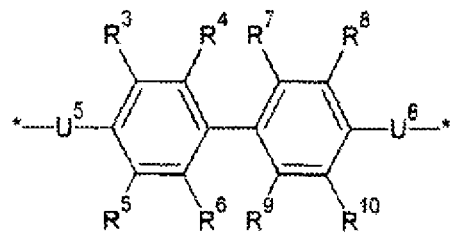

Column 13, Line 4 reads "C1 to C20 alkylamine" and should read "C1 to C20 allylamine"

Column 18, Line 50 Chemical Formula 5 is depicted as:

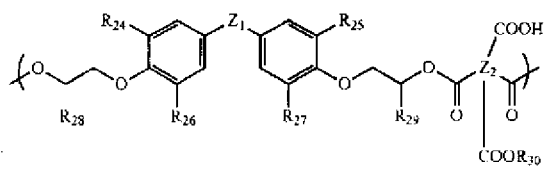

Signed and Sealed this
Thirtieth Day of April, 2013

Teresa Stanek Rea
*Acting Director of the United States Patent and Trademark Office* and should be depicted as:
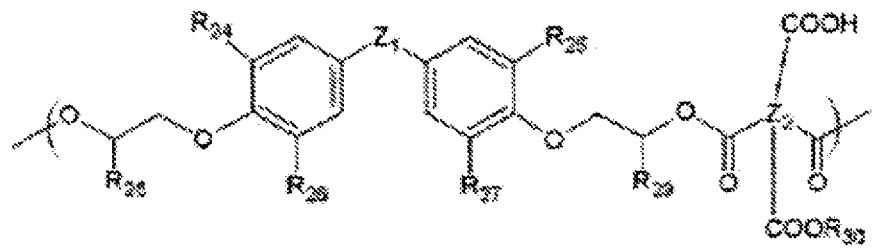
Columns 31 and 32 in Table 1, under the heading (D) pigment dispersion reads:
| (D) pigment dispersion (wt%) | 406* | 406* | 406* | 406* | 406* | 406* | 406* |
and it should read:
| (D) pigment dispersion (wt%) | 40 6* | 40 6* | 40 6* | 40 6* | 40 6* | 40 6* | 40 6* |
In the Claims
Claim 1, Column 33, Line 47 reads "n is an integer ranging from 2 to 3:" and should read "n is an integer ranging from 2 to 4:"